United States Patent
Kuo

(10) Patent No.: US 9,362,060 B2
(45) Date of Patent: Jun. 7, 2016

(54) TOUCH ELECTRODE DEVICE

(71) Applicant: HengHao Technology Co. LTD, Taoyuan County (TW)

(72) Inventor: Yi-Peng Kuo, Taoyuan County (TW)

(73) Assignee: Henghao Technology Co. Ltd., Pingjhen, Taoyuan County (TW)

( * ) Notice: Subject to any disclaimer, the term of this patent is extended or adjusted under 35 U.S.C. 154(b) by 99 days.

(21) Appl. No.: 13/728,896

(22) Filed: Dec. 27, 2012

(65) Prior Publication Data

US 2014/0151214 A1    Jun. 5, 2014

(30) Foreign Application Priority Data

Nov. 30, 2012 (TW) ............... 101145014 A

(51) Int. Cl.
| | |
|---|---|
| G06F 3/041 | (2006.01) |
| H05K 1/09 | (2006.01) |
| H05K 1/11 | (2006.01) |
| G06F 3/045 | (2006.01) |
| H01H 1/02 | (2006.01) |
| H03K 17/96 | (2006.01) |

(52) U.S. Cl.
CPC ............... *H01H 1/02* (2013.01); *H03K 17/962* (2013.01); *H03K 2017/9606* (2013.01); *H03K 2217/960765* (2013.01)

(58) Field of Classification Search
CPC .................................... H03K 17/962
USPC ............................ 345/173, 174; 174/257, 261
See application file for complete search history.

(56) References Cited

U.S. PATENT DOCUMENTS

| | | | |
|---|---|---|---|
| 2003/0164243 A1* | 9/2003 | Arakawa et al. | 174/35 MS |
| 2006/0163197 A1* | 7/2006 | Arakawa et al. | 216/41 |
| 2007/0165004 A1* | 7/2007 | Seelhammer et al. | 345/173 |
| 2009/0117342 A1* | 5/2009 | Lee et al. | 428/195.1 |
| 2010/0007619 A1* | 1/2010 | Jiang et al. | 345/173 |
| 2010/0028811 A1* | 2/2010 | Geaghan | 430/319 |
| 2010/0156840 A1* | 6/2010 | Frey et al. | 345/174 |
| 2010/0164900 A1* | 7/2010 | Lin | G06F 3/044 345/174 |
| 2010/0295812 A1* | 11/2010 | Burns et al. | 345/174 |
| 2011/0018424 A1* | 1/2011 | Takada | H01L 31/022466 313/352 |
| 2011/0102370 A1* | 5/2011 | Kono et al. | 345/174 |
| 2011/0169517 A1* | 7/2011 | Kim et al. | 324/756.03 |
| 2011/0279398 A1* | 11/2011 | Philipp | 345/174 |
| 2012/0127097 A1 | 5/2012 | Gaynor et al. | |
| 2012/0182256 A1* | 7/2012 | Kitada | G06F 3/0416 345/174 |
| 2012/0262382 A1* | 10/2012 | Guard et al. | 345/173 |

OTHER PUBLICATIONS

Office Action Dated Sep. 29, 2015 in corresponding Korean Patent Application No. 20-2013-0008724.

* cited by examiner

*Primary Examiner* — Sherman Ng
(74) *Attorney, Agent, or Firm* — Donald E. Stout; Stout, Uxa & Buyan, LLP

(57) ABSTRACT

A touch electrode device includes a substrate, at least one electrode layer and a conductive ink pattern. The electrode layer is disposed above a surface of the substrate, and the electrode layer includes non-transparent conductive material. The conductive ink pattern is printed on two sides of a surface of the electrode layer.

9 Claims, 4 Drawing Sheets

TOUCH ELECTRODE DEVICE

CROSS-REFERENCE TO RELATED APPLICATIONS

The entire contents of Taiwan Patent Application No. 101145014, filed on Nov. 30, 2012, from which this application claims priority, are incorporated herein by reference.

BACKGROUND OF THE INVENTION

1. Field of the Invention

The present invention generally relates to a touch electrode device, and more particularly to a touch electrode device having electrodes made up of non-transparent conductive material.

2. Description of Related Art

A touch screen is an input/output device that adopts sensing technology and display technology, and has been widely employed in electronic devices such as portable or hand-held electronic devices.

A capacitor-based touch panel is a commonly used touch panel that utilizes capacitive coupling effect to detect touch position. Specifically, capacitance corresponding to the touch position changes and is thus detected, when a finger touches a surface of the touch panel.

FIG. 1 shows a cross-sectional view of a conventional touch panel. Specifically, the first electrode layer 11 and the second electrode layer 12 are formed on a top surface of a substrate 10 in sequence. The first electrode layer 11 has a first electrode column 11A and a first film 11B, and the second electrode layer 12 has a second electrode column 12A and a second film 12B. Specifically, the first electrode column 11A and the second electrode column 12A are respectively disposed on bottom surfaces of the first film 11B and the second film 12B. Moreover, the first electrode layer 11 and the second electrode layer 12 are fixed to each other by the optical cement 15. As shown in FIG. 1, the first film 11B is fixed to the second electrode column 12A by the optical cement 15. Moreover, the decorative film 13 is formed on a top surface of the second electrode layer 12, and the cover glass 14 is disposed on a top surface of the decorative film 13.

The first electrode column 11A and the second electrode column 12A of the conventional touch panel as discussed above are commonly made up of transparent conductive material such as indium tin oxide (ITO). As the ITO is formed by using a complex process and the thickness of each ITO electrode layer is usually between about 100 µm and about 150 µm, so it may cause to increase the overall thickness and result in poor yield for the decorative film. Consequently, it is difficult to reduce the production costs of the touch panel.

For the reason that the conventional touch panel requires complex manufacturing process and cannot afford to make a thin touch panel, a need has thus arisen to propose a novel touch electrode device to overcome disadvantages of the conventional touch panel.

SUMMARY OF THE INVENTION

In view of the foregoing, it is an object of the embodiment of the present invention to provide a touch electrode device with the simplified structure, made up of non-transparent conductive material, so as to achieve the thinning effect or simplify a process by directly performing photolithography.

According to one embodiment, a touch electrode device includes a substrate and at least one transparent electrode layer and a conductive ink pattern. The electrode layer is directly or indirectly disposed on a surface of the substrate, and the electrode layer includes non-transparent conductive material. The conductive ink pattern is directly or indirectly printed on a portion of a surface of the at least one electrode layer.

Moreover, the electrode layer may further include a metal-trace layer. The metal-trace layer is disposed on two sides of the surface of the electrode layer, and the conductive ink pattern is printed on the metal-trace layer for transmitting the sensing signal from the electrode layer.

DETAILED DESCRIPTION OF THE INVENTION

As used in the description herein and throughout the claims that follow, the meaning of "a," "an" and "the" includes plural reference unless the context clearly dictates otherwise. Also, as used in the description herein and throughout the claims that follow, the meaning of "in" includes "in" and "on" unless the context clearly dictates otherwise.

As used herein, "around," "about" or "approximately" shall generally mean within 20 percent, preferably within 10 percent, and more preferably within 5 percent of a given value or range. Numerical quantities given herein are approximate, meaning that the term "around," "about" or "approximately" can be inferred if not expressly stated.

Figure 1:
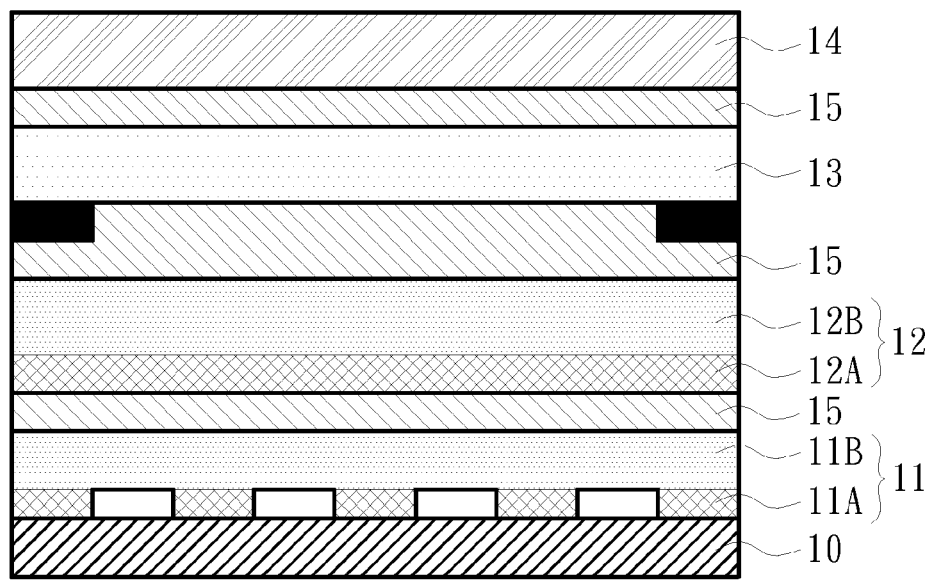
FIG. 1 shows a cross-sectional view of a conventional touch panel.
Figure 2A:
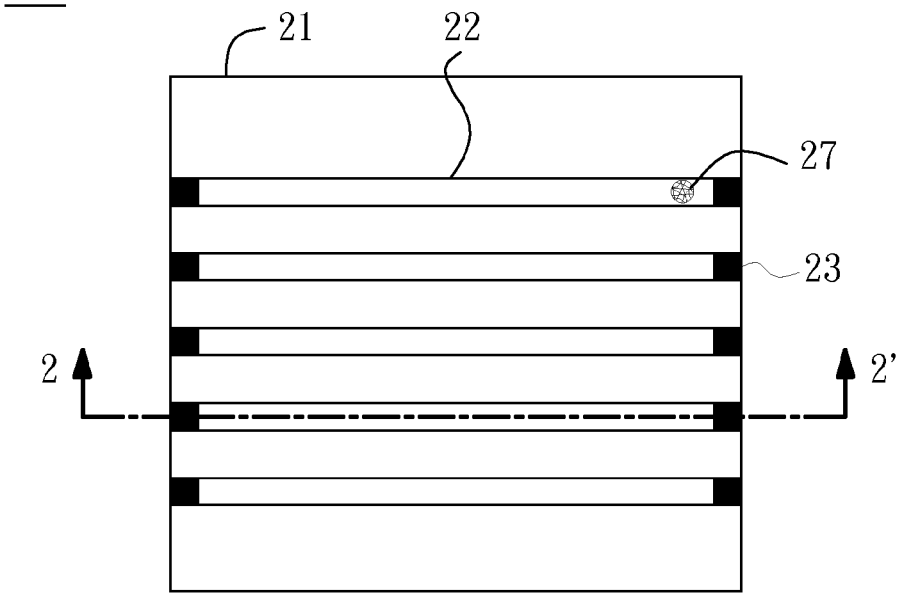
FIG. 2A shows a top view of a touch electrode device according to one embodiment of the present invention.
Figure 2B:
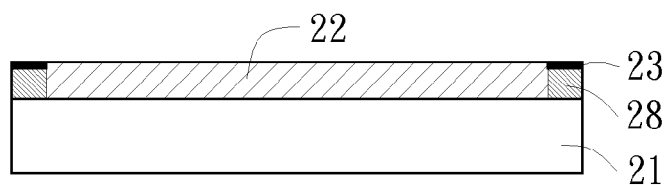
FIG. 2B shows a cross-sectional view along a section line 2-2' in FIG. 2A.

FIG. 2A shows a top view of a touch electrode device 200 according to one embodiment of the present invention, and FIG. 2B shows a cross-sectional view along a section line 2-2' in FIG. 2A. Only composing elements pertinent to the embodiment are shown in the figures. The touch electrode device 200 of the embodiment includes a substrate 21, at least one electrode layer 22 and a conductive ink pattern 23. The electrode layer 22 may, but not necessarily, be disposed on a surface (e.g., a top surface) of the substrate 21. The conductive ink pattern 23 is printed on two sides of a surface of the electrode layer 22 for transmitting a sensing signal from the electrode layer 22. Moreover, the color of the conductive ink pattern 23 may vary with the actual design requirement. In this embodiment, the color of the conductive ink pattern 23 is illustrated as being black.

Furthermore, in an embodiment, the electrode layer 22 may further include a metal-trace layer 28. The metal-trace layer 28 may be disposed on two sides of the electrode layer 22, for transmitting a sensing signal from the electrode layer 22. The conductive ink pattern 23 is printed on the metal-trace layer 28, so as to be electrically connected to the metal-trace layer 28. Consequently, the sensing signal may be transmitted to a signal processor (not shown) of the touch electrode device

200 by the conductive ink pattern 23, for processing the sensing signal and outputting the corresponding video signal.

According to one aspect of the embodiment, the electrode layer 22 includes non-transparent conductive material, such as metal wires, a copper mesh or a silver mesh. Each of the metal wires has a diameter of some nanometers to hundreds of nanometers. This embodiment of the present invention is illustrated with the metal wires.

The metal wires are fixed, by plastic material (e.g., resin) or photosensitive (e.g., acrylic), in the electrode layer 22. As the metal wires are too thin to be observed by human eyes, the electrode layer 22 made of the metal nanowires thus has high transmittance. Moreover, the thickness of the electrode layer 22 may be between about 0.1 μm and about 1 μm, such that the overall thickness of the touch electrode device 200 could be decreased.

Figure 2C:
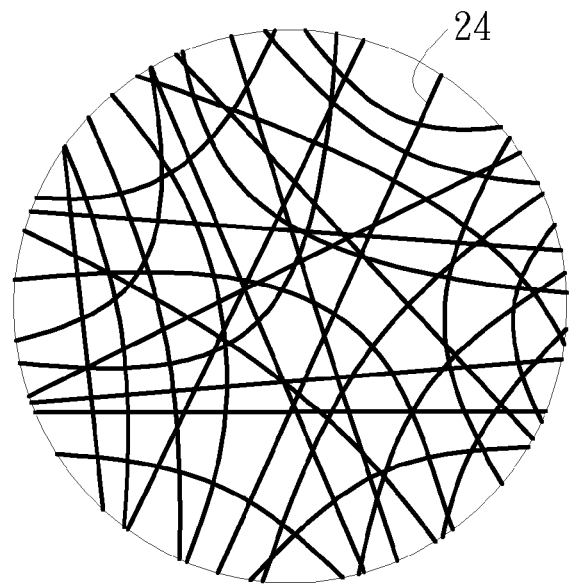
FIG. 2C shows a partial enlarged section of the electrode layer in FIG. 2A.

FIG. 2C shows a partial enlarged section 27 of the electrode layer 22 in FIG. 2A. As shown in FIG. 2C, the metal wires 24 are interleaved with each other and flatly distributed in the electrode layer 22, and the electrode layer 22 made of the metal wires therefore has an isotropic conductivity, which is substantially invariant with respect to direction.

According to another aspect of the embodiment, when the electrode layer 22 includes photosensitive material (e.g., acrylic), the electrode layer 22 may be subjected directly to a photolithographic process to result in the patterned electrode layer 22 with required pattern. In an embodiment, each electrode of the column electrodes may have a diamond shape. However, the shape of the electrodes in the present invention is not limited to the diamond shape and may also be implemented by various suitable shapes, so the shape of the electrodes may have other shapes as well such as rectangles, or other polygon shapes, which could meet the actual design requirements. Therefore, compared with a conventional process using ITO for forming an electrode layer, the electrode layer 22 of the embodiment may be directly subjected to a photolithographic process, thereby simplifying the overall process significantly, performed without using the decorative film, to reduce cost.

In the present embodiment, the substrate 21 may be a transparent substrate, which may include, for example, glass, polyester or other transparent material.

However, the substrate 21 may include flexible material, rigid material or a LCD Module, according to actual design requirements. As the metal wires in the non-transparent conductive material mentioned above are very thin in diameter, the metal wires may accompany the substrate 21 to form a flexible touch electrode device 200. To the contrary, indium tin oxide (ITO), which is conventionally used as transparent conductive material, suffers from fracture and therefore ITO is difficulty adapted to make a flexible touch electrode device.

Figure 2D:
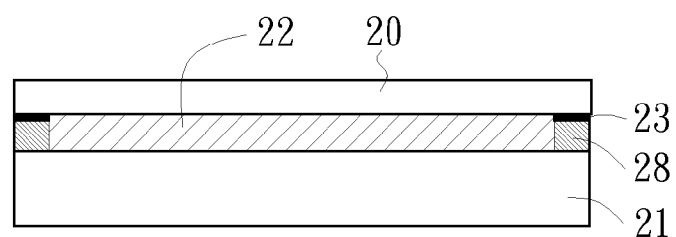
FIG. 2D shows a cross-sectional view of the electrode layer.

FIG. 2D shows a cross-sectional view of a touch device 200 according to another embodiment. The touch electrode device 200 further includes a cover glass 20, disposed on the surface of the electrode layer 22. In an embodiment, the cover glass 20 could be fixed on the surface of the electrode layer 22 by the optical cement or other transparent insulating adhesive materials. Moreover, the cover glass 20 may be a transparent cover glass and include flexible material or rigid material, and the surface material of the cover glass may be treated to have anti-wear, anti-scratch, anti-reflection, anti-glare and anti-fingerprint features.

However, in another embodiment, the touch electrode device 200 may further include an insulation layer disposed between the substrate 21 and the electrode layer 22, such that the electrode layer 22 is indirectly disposed on the surface of the substrate 21. Moreover, the insulation layer may include photoresistive material, which may then be patterned along with the electrode layer 22 via photolithographic process.

Figure 3:
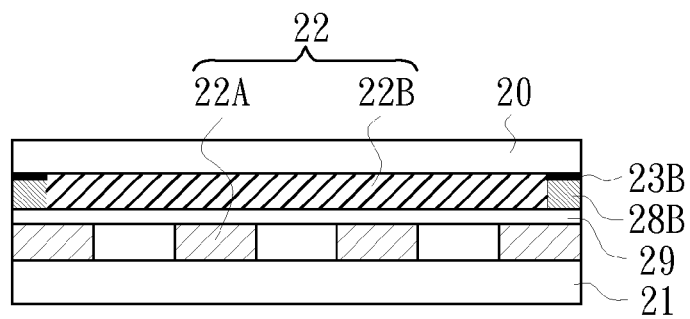
FIG. 3 shows a cross-sectional view of a touch panel according to another embodiment of the present invention.

The touch electrode device 200 illustrated in FIG. 2A and FIG. 2B, that is, a single transparent electrode layer 22 is disposed on a single surface of the substrate 21. The embodiment, however, may adopt other structures, for example, a single-side double-layer structure. FIG. 3 shows a cross-sectional view of a touch electrode device 300 with a single-side double-layer structure. Specifically, a first electrode layer 22A and a second electrode layer 22B are formed in sequence on a surface of the substrate 21, and the first electrode layer 22A and a second electrode layer 22B are insulated from each other by an insulation layer 29. Specifically, the first electrode layer 22A and the second electrode layer 22B may respectively include a first conductive ink pattern 23A (not shown) and a second conductive ink pattern 23B. Furthermore, the touch electrode device 300 may also include a cover glass 20 disposed on a surface of the second electrode layer 22B. In an embodiment, the cover glass 20 may be fixed on a surface of the second electrode layer 22B by the optical cement or other transparent insulating adhesive materials.

In another embodiment, the touch electrode device 300 may further include an insulation layer disposed between the substrate 21 and the first electrode layer 22A, such that the first electrode layer 22A is indirectly disposed on the surface of the substrate 21. The insulation layer may include photoresistive material, which may then be patterned along with the first electrode layer 22A via photolithographic process.

Referring to FIG. 3, the second electrode layer 22B may include a second metal-trace layer 28B. The second metal-trace layer 28B may be disposed on two sides of the second electrode layer 22B, for transmitting sensing signal from the second electrode layer 22B. Specifically, the second conductive ink pattern 23B may be printed on a surface of the second metal-trace layer 28B, so as to be electrically connected to the second metal-trace layer 28B. Therefore, the second conductive ink pattern 23B may transmit the sensing signal to the signal processor in the touch electrode device 200 for outputting the corresponding video signal. Furthermore, in above embodiments, the features of the first electrode layer 22A are similar to those of the second electrode layer 22B, so the similarities are not repeated.

In another embodiment, the thicknesses of the first electrode layer 22A and the second electrode layer 22B may be respectively between about 0.1 μm and about 1 μm, and the thickness of the insulation layer 29 may be between about 5 μm and about 10 μm, and therefore the overall thickness of the touch electrode device 300 may be decreased significantly. Moreover, the insulation layer 29 may also include photoresistive material, which may then be patterned along with the second electrode layer 22B via photolithographic process.

Compared with the conventional touch electrode devices, the touch electrode device 200/300 of the embodiment includes the electrode layer 22 made of non-transparent conductive material may have the electrode layer with the simplified structure, thereby achieving the thinning effect and providing a high degree of flexibility.

Figure 4:
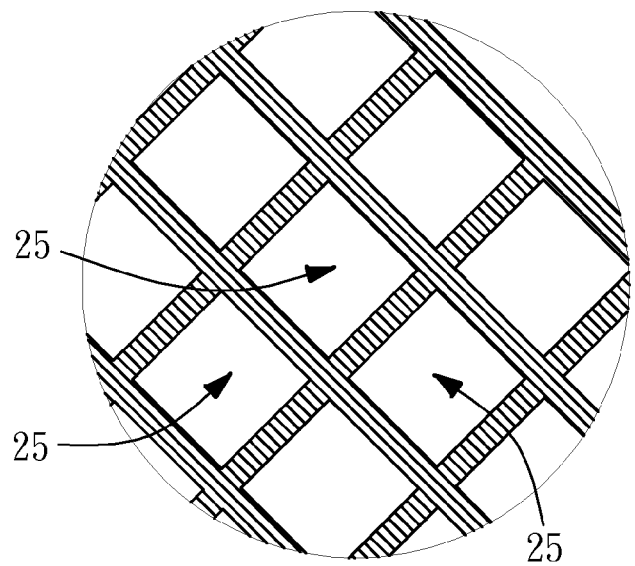
FIG. 4 shows a partial enlarged section of the electrode layer made of a copper mesh, according to another embodiment of the present invention.

FIG. 4 shows a partial enlarged section 27 of the electrode layer made of a copper mesh, according to another embodiment of the present invention. As shown in FIG. 4, the copper mesh has a plurality of cells 25. Each cell 25 may have a polygon shape or a quasi-circular shape, and the intervals of the cells may be fully penetrated by the light. Moreover, the cells 25 may be electrically connected with each other and arranged into a matrix pattern. Consequently, the electrodes may be formed by the arrangement of the cells 25, which may have a rectangular shape, a diamond shape or other polygonal shapes. Although this embodiment is illustrated with copper mesh, the present invention is not limited to thereto, and the aspects of the present invention mentioned above may be realized by silver mesh or other suitable material.

Although specific embodiments have been illustrated and described, it will be appreciated by those skilled in the art that various modifications may be made without departing from the scope of the present invention, which is intended to be limited solely by the appended claims.

What is claimed is:

1. A touch electrode device, comprising:
   a substrate;
   at least one electrode layer, disposed above a surface of the substrate, the electrode layer comprising non-transparent conductive material, wherein the non-transparent conductive material includes a plurality of metal wires, and each of the metal wires has a diameter of 1 nanometer to 999 nanometers, and the metal wires are flatly, randomly and irregularly distributed; and
   a conductive ink pattern, printed on two sides of a surface of the at least one electrode layer, so as to transmit a sensing signal from the at least one electrode layer.

2. The device of claim 1, wherein the at least one electrode layer further comprises a metal-trace layer, wherein the metal-trace layer is disposed on two sides of the surface of the at least one electrode layer, and the conductive ink pattern is printed on the metal-trace layer.

3. The device of claim 1, wherein the non-transparent conductive material comprises a copper mesh or a silver mesh.

4. The device of claim 1, wherein the electrode layer further comprises plastic material, for fixing the non-transparent conductive material in the electrode layer.

5. The device of claim 1, wherein the electrode layer further comprises photoresistive material.

6. The device of claim 1, wherein the substrate is a transparent substrate.

7. The device of claim 1, further comprising a cover glass, disposed on a surface of the at least one electrode layer.

8. The device of claim 2, wherein the at least one electrode layer comprises a first electrode layer and a second electrode layer disposed on a surface of the substrate in sequence.

9. The device of claim 8, further comprising an insulation layer disposed between the first electrode layer and the second electrode layer.

* * * * *